United States Patent [19]
Yamamoto et al.

[11] Patent Number: 5,515,316
[45] Date of Patent: * May 7, 1996

[54] NON-VOLATILE MEMORY DEVICE HAVING A MEMORY MEDIUM CONTAINING A LIQUID CRYSTAL COMPOUND

[75] Inventors: Yoshitaka Yamamoto, Yamatokoriyama; Yutaka Ishii, Nara, both of Japan

[73] Assignee: Sharp Kabushiki Kaisha, Osaka, Japan

[*] Notice: The portion of the term of this patent subsequent to Sep. 9, 2012, has been disclaimed.

[21] Appl. No.: 896,097

[22] Filed: Jun. 10, 1992

[30] Foreign Application Priority Data

Jun. 10, 1991 [JP] Japan ................... 3-138027
Oct. 30, 1991 [JP] Japan ................... 3-285133
Oct. 30, 1991 [JP] Japan ................... 3-285135
Oct. 30, 1991 [JP] Japan ................... 3-285136
Nov. 1, 1991 [JP] Japan ................... 3-287672

[51] Int. Cl.$^6$ .......................... G11C 7/00; G02F 1/133
[52] U.S. Cl. .......................... 365/182; 365/108; 365/151; 428/1; 250/331; 359/44; 359/55
[58] Field of Search .................... 365/182, 185; 428/1; 346/108; 350/350.5; 252/299.01; 250/331; 359/44, 55

[56] References Cited

U.S. PATENT DOCUMENTS

| | | | |
|---|---|---|---|
| 3,836,243 | 9/1974 | Melchior | 353/122 |
| 3,872,318 | 3/1975 | Murayama | 307/88 E T |
| 4,198,630 | 4/1980 | Serinken et al. | 340/784 |
| 4,390,244 | 6/1983 | Hareng et al. | |
| 4,653,866 | 3/1987 | Era et al. | 350/350.5 |
| 4,807,187 | 2/1989 | Tabushi | 365/108 |
| 4,965,591 | 10/1990 | Kurabayashi et al. | 346/108 |
| 4,983,318 | 1/1991 | Matsumoto et al. | 252/299.01 |
| 5,124,183 | 6/1992 | Nakano et al. | 428/1 |

FOREIGN PATENT DOCUMENTS

| | | |
|---|---|---|
| 0127140 | 5/1984 | European Pat. Off. . |
| 0291659 | 11/1988 | European Pat. Off. . |
| 2457912 | 7/1976 | Germany . |
| 3707281A1 | 9/1987 | Germany . |
| 61-118492 | 6/1986 | Japan . |
| 61-118725 | 6/1986 | Japan . |
| 2-26119 | 2/1990 | Japan . |
| 58152221 | 9/1993 | Japan . |

OTHER PUBLICATIONS

Scientific American, vol. 263, No. 5 Nov., 1990 pp. 88–89.
Digest of Papers; Compcon Spring 84—San Francisco, pp. 110–114 Carter "Prospects for Computation at The Molecular Size Level".
Optical Computing & Processing, vol. 1, No. 1, Jan. 1991 pp. 13–21.
Polymer Liquid Crystals, Polymer, vol. 38, pp. 376–379, May 1989 (partial).

*Primary Examiner*—Viet G. Nguyen
*Attorney, Agent, or Firm*—David G. Conlin; Peter F. Corless

[57] ABSTRACT

A non-volatile memory device which includes a recording medium, a heating means for heating the recording medium, a reading means for reading the information stored in the recording medium, and the recording medium containing a liquid crystal compound.

14 Claims, 6 Drawing Sheets

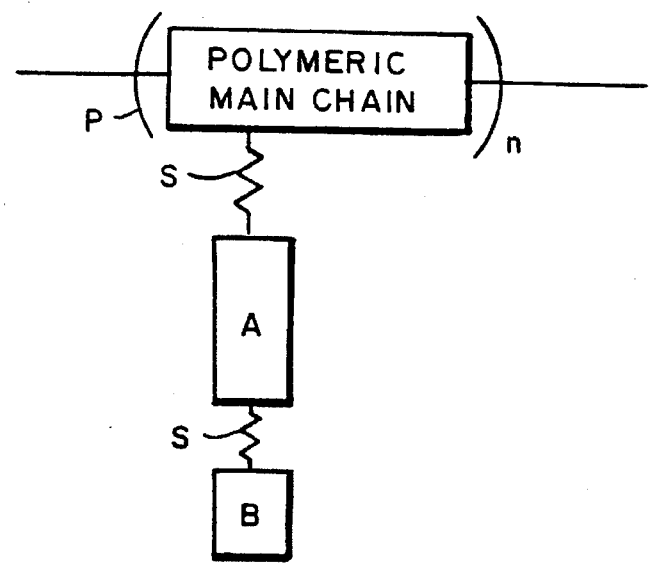
FIG. 4
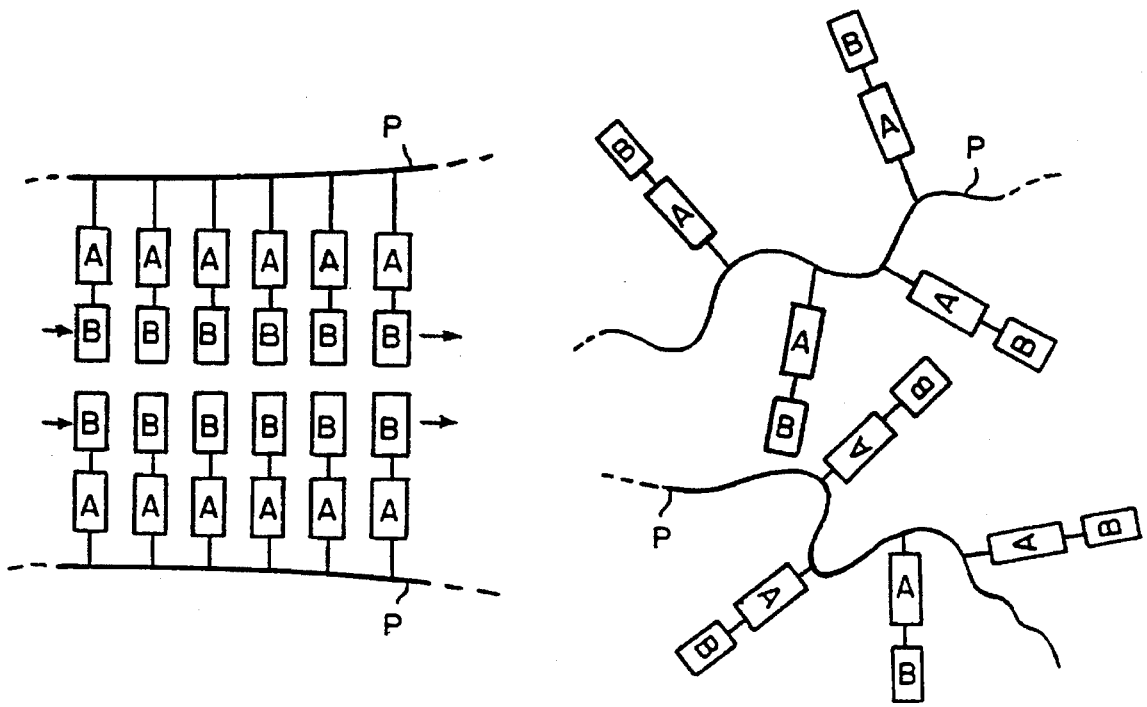
FIG. 5A
FIG. 5B

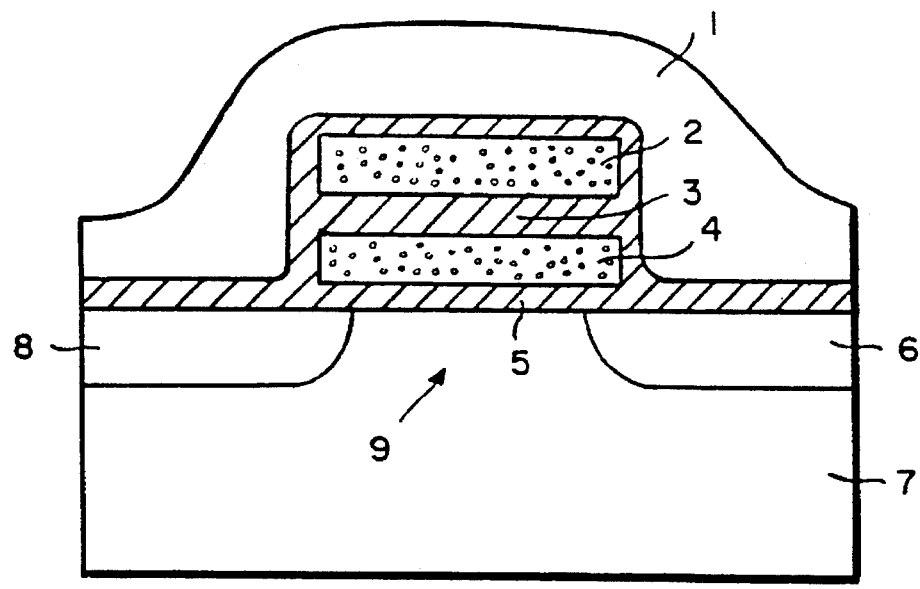
FIG. 9
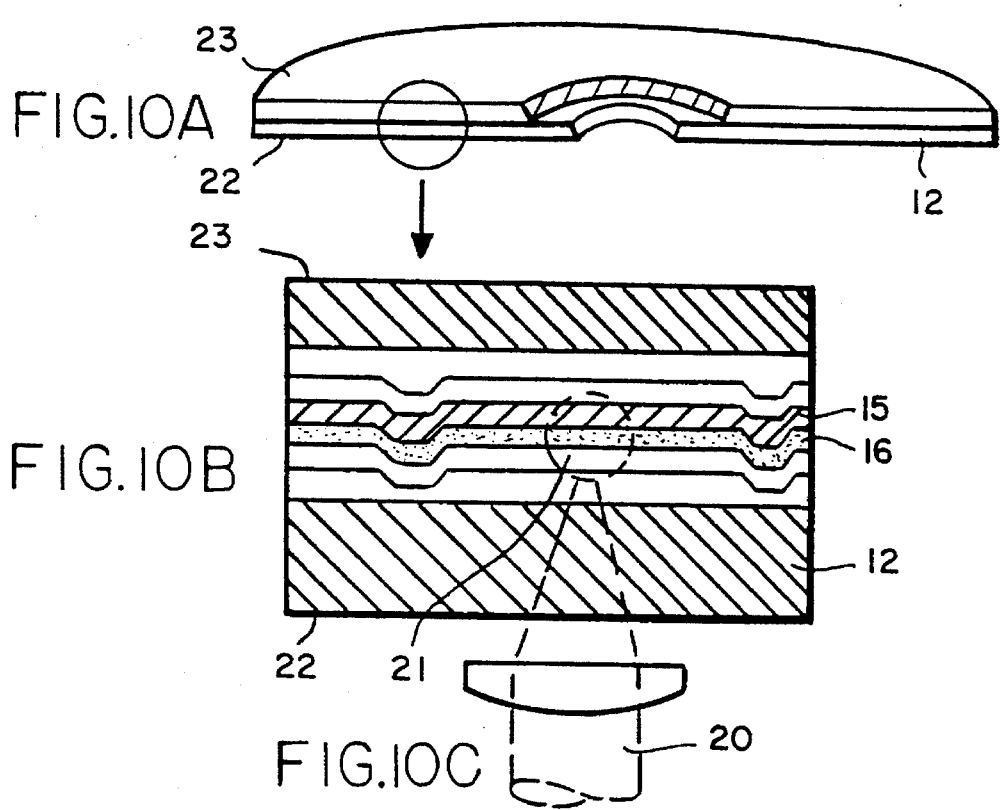
FIG.10A
FIG.10B
FIG.10C

NON-VOLATILE MEMORY DEVICE HAVING A MEMORY MEDIUM CONTAINING A LIQUID CRYSTAL COMPOUND

BACKGROUND OF THE INVENTION

1. Field of the Invention

The present invention relates to a non-volatile memory device adapted for use in a computer, a memory card, a word processor, and the like. More particularly, the present invention relates to a non-volatile memory device having a large, highly-dense capacity and is capable of electrical writing and reading information.

2. Description of the Prior Art

As non-volatile memory devices, the following four devices are well known and widely used:

(1) magnetic tapes;

(2) magnetic disks;

(3) IC non-volatile memory such as EPROM and EEPROM; and (4) optical magnetic disks.

Each of these memory devices will be more particularly described:

(1) Magnetic Tapes:

This is a typical data replaceable non-volatile memory device, and is in wide use for audio tapes and video tapes because of its inexpensive price. In addition, because of its large capacity, it is used for back-up memory in a computer. The disadvantages of the magnetic tape are that the function it can perform is only the writing and reading of information and the access time is long in writing and reading.

(2) Magnetic Disks:

Magnetic disks are in wide use as an external memory device for computers and word processors. Magnetic disks include floppy disks which are handy and inexpensive, and hard disks which have a large storage capacity but are difficult to handle and are expensive. The advantages are that high speed random access is possible, and writing and reading are readily practicable. A 3.5 inch floppy disk has a storage capacity of about 1 megabytes (M bytes), and a 3.5 inch hard disk has a capacity of about 40M bytes. However, the capacity and density cannot be increased further.

(3) EPROM and EEPROM:

Each is a typical example of IC non-volatile memory devices which allow the ready replacement of data and highly dense storage. There are two types; an EPROM in which the writing is electrically effected, and erasing is effected by ultraviolet irradiation, and an EEPROM in which the writing and erasing are electrically effected. Advantageously, this type of IC non-volatile memory device has a small and lightweight size, has a short access time, and is energy-saving.

Referring to FIG. 9, the writing and erasing under the EEPROM system will be described:

Information is recorded by applying voltage between a drain area 6 and a control gate 2 and injecting a carrier into a floating gate 4. The recorded information is erased by applying voltage between the source area 8 and the control gate 2, and removing the carrier under the Fowler-Nordheim (N-F) Tunneling phenomenon. The recorded information is read by judging the ON or OFF by a threshold voltage of a reversal voltage. Since the carrier is injected and removed through a gate oxide layer 5, the quality and thickness of the carrier affect the quality of EEPROM. For example, an EEPROM having a storage capacity of 1 Mega bit (M bit) has a gate oxide layer having a thickness of 20 nm. It is difficult to produce layers to such a narrow thickness, thereby decreasing the yield of production. As a result, the production cost is increased. A chip normally has sides of 7 to 10 mm in length, and in order to increase the storage capacity, the area of a chip is increased but this reduces the production yield. As a result, the production cost is increased.

Because of these disadvantages, the storage capacity of an EEPROM cannot be increased beyond a certain limit. In recent years, the average storage capacity of EEPROMs is in the range of 1 to 4M bits, which is smaller than that of magnetic disks and optical magnetic disks.

(4) Optical Magnetic Disks:

This is a typical example of a non-volatile large capacity data replaceable optical disk.

Referring to FIG. 10, this type of disk utilizes a laser beam 20 so as to record data, and the advantage is that since the data is recorded through a transparent glass substrate 12 in a non-contact state, dust present on a recording surface 23 is not likely to prevent the recording of data. Since the laser beam is not focused on the substrate 22, and has a larger diameter of about a few hundreds of microns, the presence of dust will not seriously affect the recording of data. Optical-electromagnetic disks have a relatively large storage capacity because the focused laser beam 20 records and reproduces, and therefore, a highly dense recording is achieved. For example, a 3.5 inch disk has a storage capacity of about 120M bytes.

One of the disadvantages is that a rotary device is required for rotating the laser generator, the magnet, and the disk for writing and reading the information, thereby requiring a relatively large peripheral device and increasing the production cost.

For an ideal type of non-volatile memory device, the following requirements (a) to (d) must be satisfied:

(a) A large, dense storage capacity can be achieved;

(b) Anti-shock, anti-vibration can be ensured;

(c) The size can be compact and simple, and the price must be inexpensive; and (d) A high speed reading and writing are achievable.

The known memory devices listed (a) to (d) above do not satisfy all these requirements.

SUMMARY OF THE INVENTION

The non-volatile memory device of this invention, comprises a memory medium filled between a substrate and a counter-substrate, the memory medium containing a liquid crystal compound, a heating means for heating the memory medium so as to write information in the memory medium, a read-out means for reading the recorded information, the heating means comprising upper and lower electrodes disposed face-to-face one of which is extended in the same direction as either of the substrates, heat generating means sandwiched between the electrodes, and insulating layers interposed between heating means adjacent in directions perpendicular to the upper and lower electrodes, the insulating layers having a low thermal diffusibility.

Thus, the invention described herein makes possible the objective of providing a memory device which has a large memory capacity, is capable of holding information over a long period of time with great stability, and is capable of easy and economical production because of the simplified structure.

BRIEF DESCRIPTION OF THE DRAWINGS

This invention may be better understood and its numerous objects and advantages will become apparent to those skilled in the art by reference to the accompanying drawings as follows:

FIG. 4 is a diagrammatic view showing the chemical structure of an electro-conductive polymer liquid crystal;

FIGS. 5A and 5B are diagrammatic comparative views showing orderly and disorderly states of the mesogen section and electric charge carrier complexes of an electro-conductive polymer liquid crystal, respectively;

FIG. 9 is a view showing the structure of a known EEPROM; and

FIG. 10 is a view showing the structure of a known optical magnetic disk.

DESCRIPTION OF THE PREFERRED EMBODIMENTS

Figure 1:
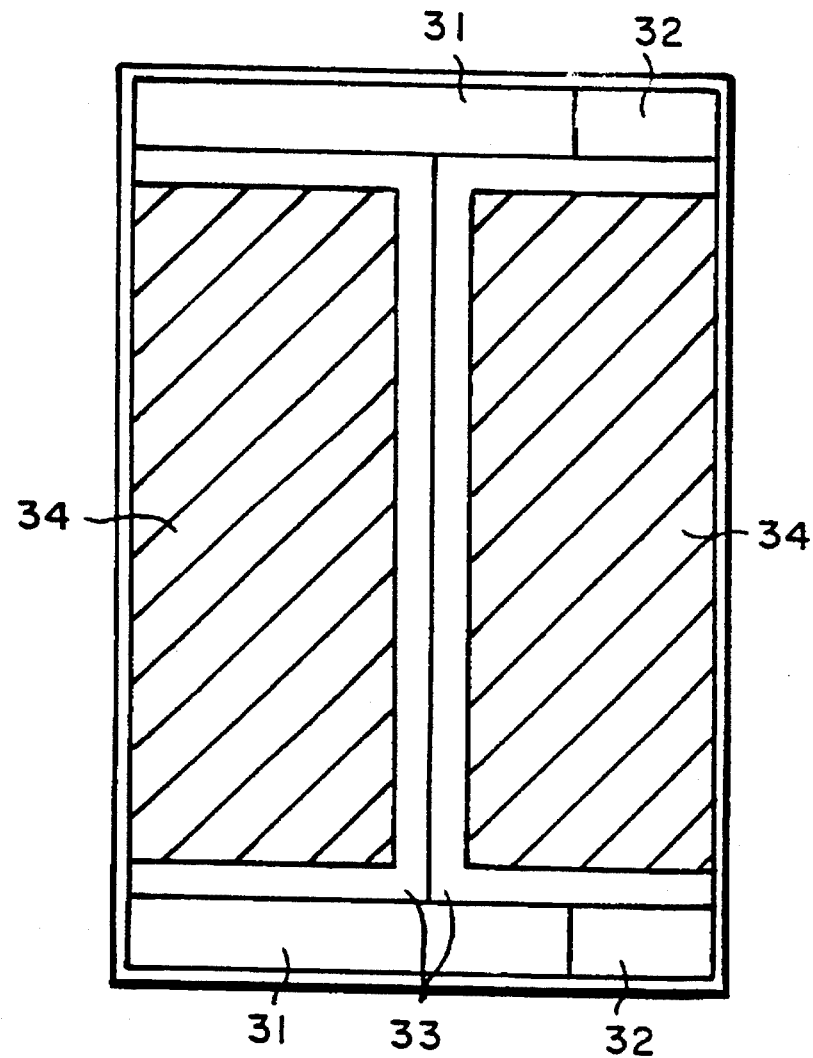
FIG. 1 is a diagrammatic view showing the front surface of the memory device according to the present invention.

Referring to FIG. 1, the exemplary memory device includes an input/output signal control 31 which has two functions of (1) sending an input signal after processing it to a recorder 34 (written information), and (2) sending a signal read out by the recorder 34 to another device. All the signals in the memory device are controlled by a logic controller 32. A driver circuit 33 allows a current to flow so as to supply an electric signal to the recorder 34 in response to the logic controller 32. The recorder 34 stores signals from the logic controller 32 as recorded information.

Figure 2:
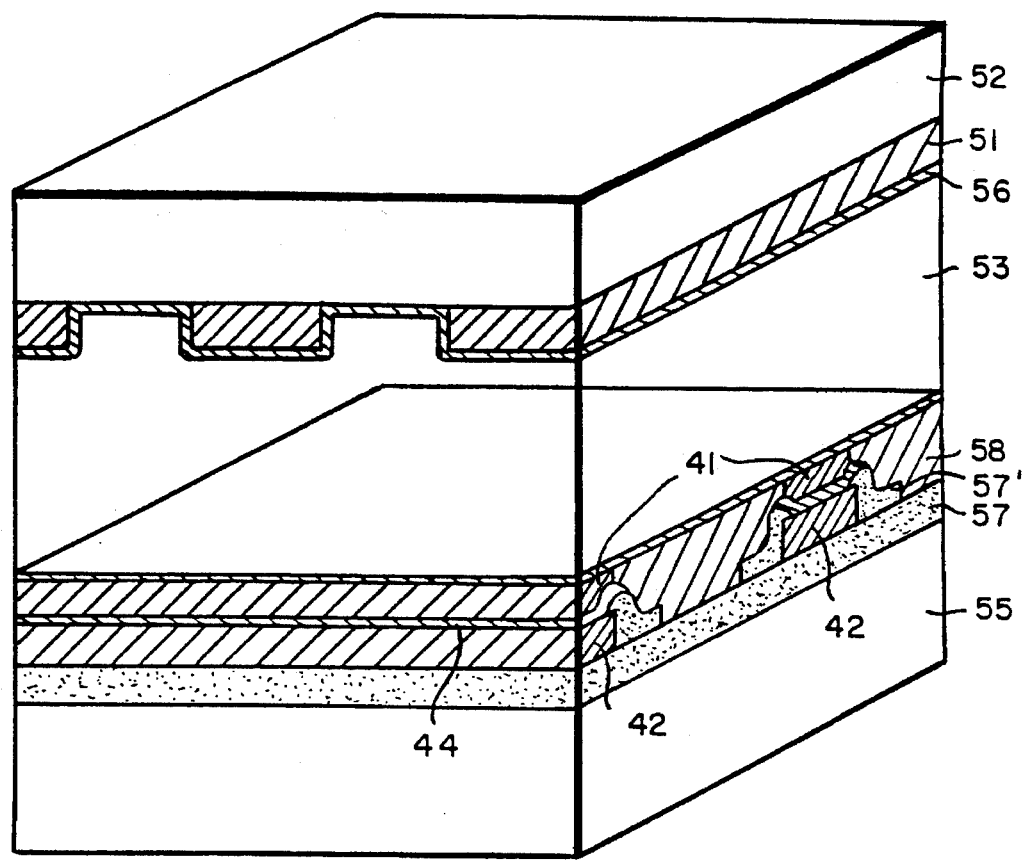
FIG. 2 is a perspective view showing the recorder of the memory device of FIG. 1.

Referring to FIG. 2, the structure of the recorder 34 will be described:

The recorder 34 includes a heat generating layer 44 for use in writing information and erasing the recorded information and a silicon substrate 55 having two kinds of electrodes for enabling a current to pass through the heat generating layer 44 and a glass substrate 52 having a liquid crystal 53 as memory medium confined between the silicon substrate 55 and the glass substrate 52.

The glass substrate 52 is provided with counter electrodes 51 in parallel on which an aligning layer 56 is formed. The silicon substrate 55 is covered with a field insulating layer 57 on which the two kinds of electrodes are formed with the heat generating layer 44 sandwiched therebetween. A lower electrode 42 is located on the insulating layer 57, and an upper electrode 41 is located on the lower electrode 42 with the heat generating layer 44 sandwiched therebetween. The field insulating layer 57 covers the silicon substrate 55 so as to prevent the driving current from leaking through between the upper electrode 41 and the lower electrode 42.

The upper electrode 41, the lower electrode 42 and the heat generating layer 44 constitute a heating means; hereinafter they will be generally referred to as "heating means". A plurality of heating means are arranged at equal intervals perpendicular to the counter electrodes 51 on the glass substrate 52. Reading and writing are effected in the areas of liquid crystal where the heating means and the counter electrodes 51 overlap each other; hereinafter these ares will be referred to as "memory cells". The use of the heating means is likely to cause detrimental crosstalk due to heat, and therefore, it is necessary to eliminate the occurrence of thermal crosstalk.

The upper electrodes 41 and lower electrodes 42 are arranged in parallel with each other with the heat generating layers 44 sandwiched therebetween. The application of voltage generates heat along the heat generating layer 44 but the adjacent electrodes are electrically disconnected, so that no crosstalk occurs therebetween in the direction perpendicular to the electrodes. Crosstalk in the horizontal direction to the disposition of the electrodes provides no problem because the heat generating layers 44 are heated at the same time as when information is written. The adjacent heating means are separated by an insulating material 58 which prevents heat from being transferred from one memory cell to the next, which otherwise would cause crosstalk.

Figure 3:
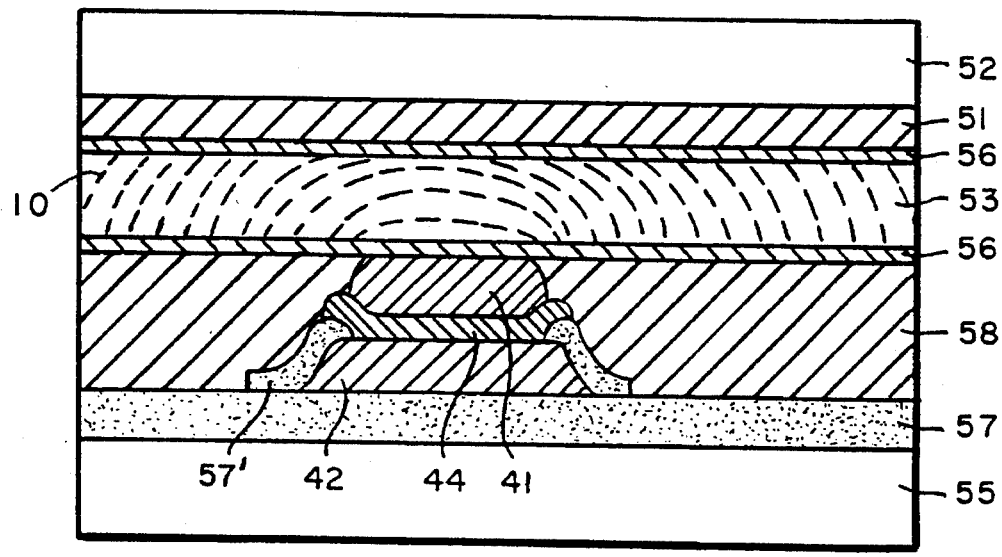
FIG. 3 is a diagrammatic view showing temperature distribution around a heat generating zone.

FIG. 3 shows the distribution of temperatures in the heating section. The decline of isotherms 10 shows that the temperatures of the liquid crystal 53 drop as the distance becomes far from the heating section. The memory cells to be heated cause no thermal crosstalk between the adjacent memory cells in the direction perpendicular to the orientation of the heating means. The memory cells adjacent to each other in the direction of orientation of the heating means are equally heated, so that no thermal crosstalk occurs in this direction.

In the illustrated embodiment the upper electrodes 41 and the lower electrodes 42 are arranged in the same direction but it is possible to arrange them perpendicular to each other without causing crosstalk, in which case it is necessary to remove the unnecessary parts, for example, by narrowing the widths of either of the electrodes 41 and 42 or both located between the heating means. Aligning layers 56 are formed on the upper electrodes 41 and the heat generating layers 44, and the liquid crystal 53 keep in contact with the aligning layer 56.

The recorder 34 will be fabricated in the following manner:

A p-type monosilicon wafer (6 inches)(100) was used for the silicon substrate 55 having impurities added to control resisting values. The silicon substrate 55 was covered with a field insulating layer 57 to a thickness of 800 nm. The field insulating layer is made of $Si_3N_4$ or $SiO_2$. Then, a tungsten layer is formed to a thickness of 1.2 μm by a vacuum CVD method. The tungsten layer was subjected to photolithographic treatment and dry etching so as to remove unnecessary portions and form the lower electrodes 42 in pattern.

Then, another insulating layer 57' was formed on the field insulating layer 57 with $Si_3N_4$ or $SiO_2$ which covers the lower electrode 42. Then, holes were made in the insulating layer 57' by removing a portion corresponding to the top surface of the lower electrodes 42 against the upper electrode 41 by photolithographic and dry etching methods. Polysilicon was placed in the holes by a vacuum CVD method, wherein the polysilicon had a resistivity of about 1,000 Ωcm and a thickness of about 1.0 μm. In this way, the heat generating layers 44 were formed.

Polysilicon can be doped with impurities such as boron and phosphor with the result of decreased resisting values, due to which the heat generating layer 44 is likely to fail to reach a predetermined temperature when it is heated. Special attention must be paid to the purity of the materials to which the vacuum CVD method is applied and to the cleanliness of the equipment.

Highly pure monosilane gas can be used as a material for polysilicon, with the application of a vacuum CVD method to form the heat generating layers 44, but various other processes using other silicon compounds are possible if they are heat-proof and have a required resisting value.

Then, the unnecessary portions of the lower electrodes 42, except for the heat generating layers 44, are removed by a photolithographic method and dry etching.

Following which, a tungsten layer having a thickness of about 1.0 μm is formed by a vacuum CVD method, and this tungsten layer is patterned by a photolithographic method and dry etching so as to form the upper electrode 41. Tungsten can enhance the heat-proof property of the electrodes 41 and 42, but any other suitable substance can be selectively used if they have the same favorable effects. The processing methods are not limited to photolithographic and dry etching but any other process can be selected if it is effective for producing layers to an equal thickness.

Then, polyimide is applied to the openings between the adjacent heating means to form polyimide layers 57' which are then polished on their surface. In this way insulating layers 58 are formed. Polyimide has a relatively low thermal diffusibility for which reason it is effective for fabricating the insulating layers 58. The surface of the upper electrodes 41 and that of the insulating layers 58 are flush with each other. The surfaces of the upper electrodes 41 and the insulating layers 58 are coated with polyimide by spinning. After the polyimide coat is heated so as to effect polymerization, unnecessary portions are removed, and the polyimide layer is rubbed. In this way the aligning layer 56 is formed. By this process, necessary portions of the upper electrodes 41, the lower electrodes 42, the heat generating layrs 44, and the insulating layers 57' remain, thereby reducing the possibilty of causing thermal crosstalk.

Tungsten, polysilicon, $Si_3N_4$, $SiO_2$ have a large thermal diffusibility so that if unnecessary portions are removed, the transfer of heat between adjacent memory cells is minimized.

After the glass substrate 52 toward the counter electrode is cut to a suitable size, it is covered with a transparent electo-conductive layer consisting of ITO (indium tin oxide) multi-layers by sputtering. Unnecessary portions of the ITO layer are removed by a photolithographic method and etching and the counter electrodes 51 are arranged. The spaces between the counter electrodes 51 and the thickness thereof are determined so as to secure the optimum conditions for writing and reading of information. The counter electrodes 51 are covered with polyimide by a spin coating method, and the polyimide coat is polymerized by heat. Then unnecessary portions are removed and treated by rubbing so as to form the aligning layer 56.

The silicon substrate 55 and the glass substrate 52 are arranged face-to-face with the respective electrodes facing each other, and the periphery of the recorder 34 is sealed.

Then, acrylic type polymeric nematic liquid crystal (Ti= 106° C., degree of polymerization: 150) having cyanobiphenyl with mesogen-radicals is filled between the silicon substrate 55 and the glass substrate 52. An a.c. voltage of 100 V (500 Hz) is applied to the nematic liquid crystal, and it is gradually cooled from the isotropic phase so as to produce a homeotropic structure. After the finished silicon substrate 55 is subjected to dicing and bonding, the memory device is contained within a container.

Since the recorder 34 is made of monosilicon substrate 55, peripheral IC circuits can be accommodated within the memory device so as to control the input and output of information, thereby reducing and simplifying the structure with the result of decreased production costs. The peripheral circuit can be made of material other than an IC circuit if it can be mounted on the monosilion substrate 55.

As shown in FIG. 4, the liquid crystal can be an electro-conductive polymer liquid crystal which has polymer main chains P, a mesogen radicals (in the liquid crystal portion) A, electro-conductivity donor radicals B, and spacers S. The mesogen radical A is connected to the polymer main chain P through the spacer S. The main chain portion is a polymer such as acryl-base polymer, a silicon-base polymer, or a metaacryl-base polymer. This polymer is effective in fixing the ends of the mesogen radical A and the electro-conductivity donor radical and affects phase transition temperatures and response speeds. The mesogen radical A is a crystal liquid compound such as azomethine-base, azoxy-base and biphenyl-base compound. The mesogen radicals are aligning from the isotropic phase in accordance with the amplitude of an applied voltage when it is cooled, and the electro-conductivity donor radicals B are forced to be arranged in order. The electro-conductivity donor radicals B are electric charge carrier complexes, and only when they are arranged in order, an electric current is allowed to flow in the direction of the arrangement so that information can be stored. Each spacer S is a methylene complex which determines the freedom of the mesogen, and the molecular length thereof affects the response speed and other characteristics of the memory device. Care must be taken in designing molecular arrangement so that the mesogen radicals and electro-conductivity donor radicals B can be easily aligning. The spacers S can be omitted.

Referring to FIG. 5A, the mesogen radicals A are arranged in order, which forces the electro-conductivity donor radicals B to orientate themselves. As a result, an electric current flows in the direction of the arrows (or the reverse direction) through the electric charge carrier complexes, thereby achieving the electro-conductivity. FIG. 5B shows a state where the mesogen radicals A are present in disorder. Therefore the electro-conductivity donor radicals B are also in disorder, thereby obtaining no current flow and remaining highly resistant.

Electro-conductive polymer having such characteristics is filled between the silicon substrate 55 and the glass substrate 52, and the conductivity condition and the non-conductivity conduction can be switched from one to the other by controlling the current flowing between the upper electrode 41 and the lower electrode 42, and the writing voltage across the upper electrode 41 and the counter electrode 51.

Figure 6:
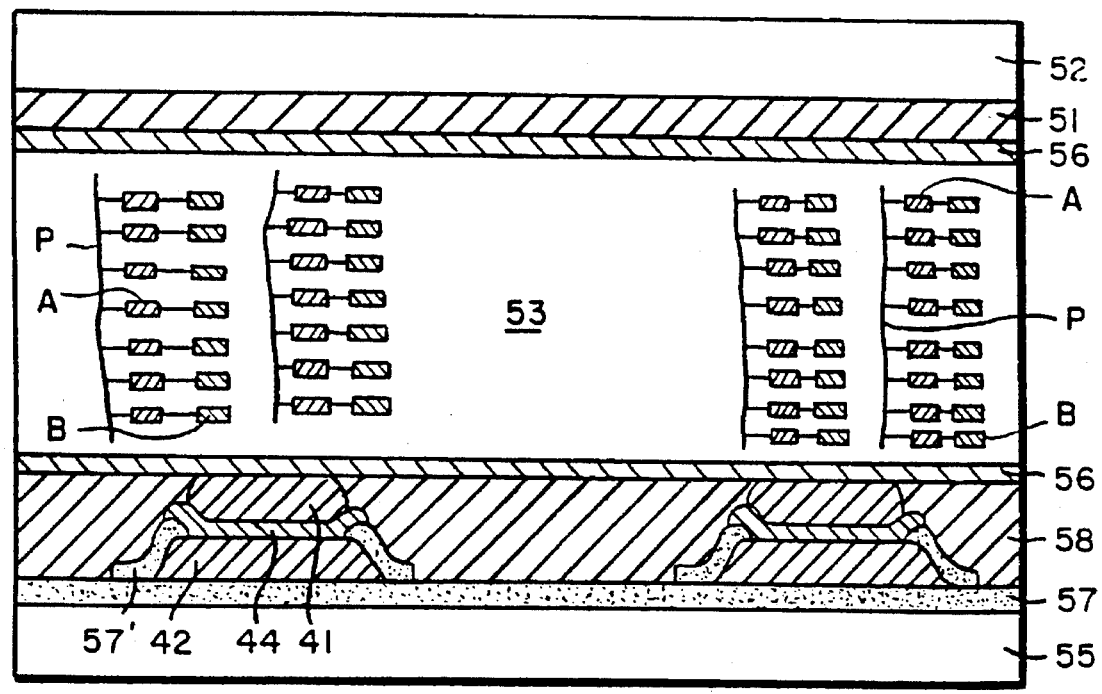
FIG. 6 is a diagrammatic view showing an electro-conductive polymer liquid crystal having the mesogen section and electric charge carrier complexes both arranged in order.
Figure 8:
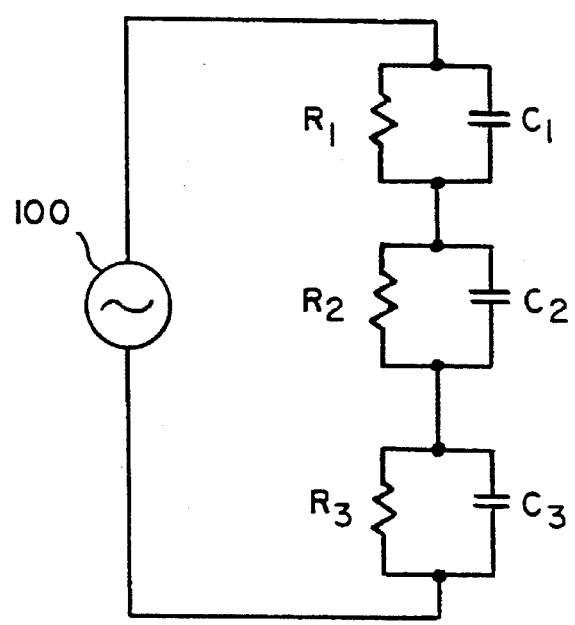
FIG. 8 is an equivalent circuit of a memory cell in the memory device according to the present invention.
Figure 7A:
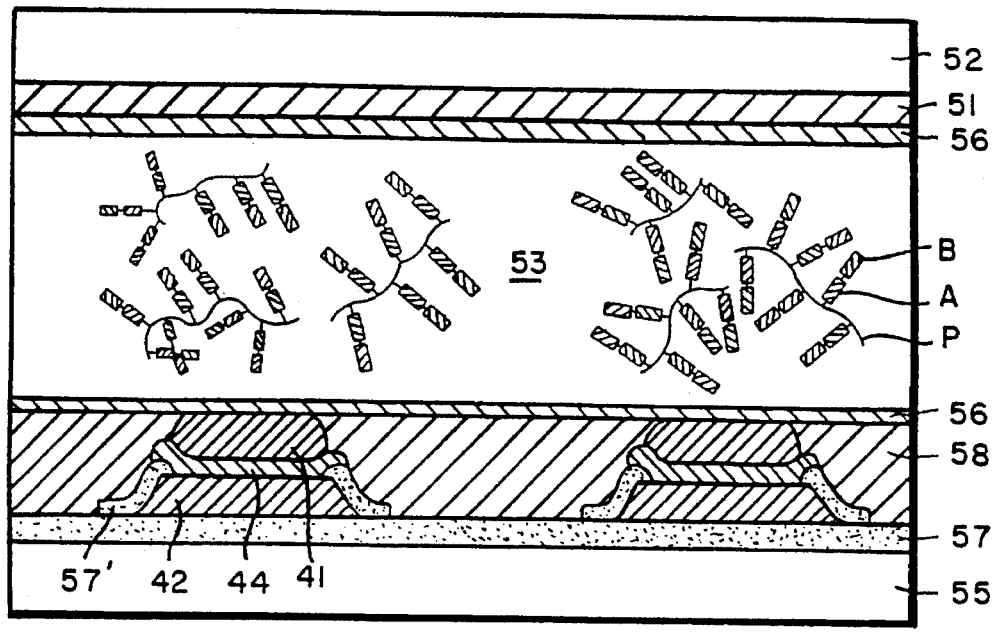
FIGS. 7A and 7B are diagrammatic comparative views showing an electro-conductive polymer liquid crystal on an enlarged scale in which the mesogen section and electric charge carrier complexes are arranged in order and in disorder, respectively.
Figure 7B:
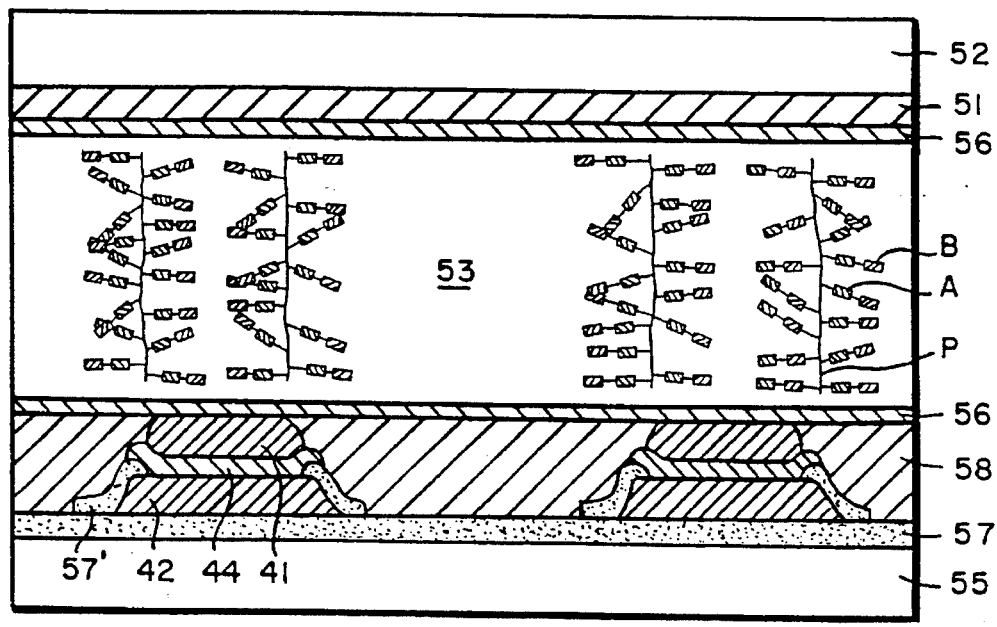

Referring to FIGS. 7A, 7B and 8, how to effect the writing and reading will be described in detail:

The electro-conductive polymer liquid crystal filled between the substrates 55 and 52 is heated to the extent that the isotropic state is reached, and quickly cooled while the information writing voltage is applied. As a result, the mesogen radicals A become aligned. The electro-conductivity donor radicals B are forced to orientate in accordance with the orientation of the mesogen radicals A. The charge is ready to move through the electric charge carrier complexes, which means that the complexes become electrically conductive. FIG. 6 shows that the liquid crystal becomes electrically conductive. When a negative inducing anisotropic liquid crystal is used as the mesogen radicals A, the mesogen radicals A exhibit homogeneous orientation. Likewise, the electro-conductivity donor radicals B exhibit homogeneous orientation. If the electric charge carrier complexes overlap each other, the conductivity occurs in the overlapping direction. FIG. 6 shows that the counter electrode 51 and the upper electrode 41 become conductive.

If the liquid crystal at the isotropic state is cooled without applying the writing voltage thereto, the mesogen radicals A remain in disorder, thereby keeping the electric charge carrier in disorder. Thus the liquid crystal 53 does not become electrically conductive but remains resistant.

FIGS. 7A and 7B show that the liquid crystal 53 become highly resistant. In FIG. 7A the polymer main chain P, the mesogen radicals A and the electro-conductivity donor radicals B are present in disorder. In FIG. 7B the polymer main chain P is in order but the mesogen radicals A are in disorder, thereby resulting in the disorder of the electric charge carrier complexes. Thus, no electric current is allowed to flow. The upper electrodes 41 and the counter electrodes 51 are in a resistant state. The states shown in FIG. 7A or 7B depend upon the heating temperatures, the aligning treatment of the substrates, and the nature of the liquid crystal 53. In order to increase the response speed, the state of FIG. 7B is preferable.

The above-mentioned electrically conductive state or the high resistant state is determined by applying an a.c. or d.c. voltage between the upper electrodes 41 and the counter electrodes 51 and detecting the impedance or conductivity of the liquid crystal 53.

The writing, replacing and reading of information are conducted as follows:

Writing and Replacing of Information

The information input from outside is stored in a buffer memory in the input/output signal controller 31, and after being appropriately processed, it is written in the recorder 34. The writing is effected by heating the liquid crystal 53 through the application of voltage to the heat generating layer 44 present between the upper electrodes 41 and the lower electrodes 42 on the silicon substrate 55. When the liquid crystal 53 becomes isometric, the application of voltage is suspended while the writing voltage is applied between the upper electrode 41 and the counter electrode 51 so as to allow the liquid crystal 53 to cool. In this way the liquid crystal 53 becomes electrically conductive. At this stage, the liquid crystal 53 has a resistivity $\rho$ of $10^6$ to $10^8$ $\Omega$cm.

After the liquid crystal 53 becomes isometric, the liquid crystal 53 is cooled without applying an information writing voltage thereto. Thus, the liquid crystal 53 becomes highly resistant, and has a resistivity of $10^{12}$ to $10^{13}$ $\Omega$cm.

The conductive state and non-conductive state are replaceable from one to the other. The information writing position in relation to the memory cells in the recorder 34 can be optionally selected, thereby making random access practicable.

Reading of Information

An a.c. or d.c. voltage is applied between the upper electrodes 41 on the silicon substrate 55 and the counter electrodes 51, and the conductivity or impedance of the liquid crystal 53 is measured. More specifically, the liquid crystal 53 has different resistivities when the mesogen radicals A are present in disorder with the result of the electro-conductivity donor radicals B being in disorder, and the mesogen radicals A are aligned in order still with the electro-conductivity donor radicals B being in disorder. This difference in conductivity is utilized to read information. It is possible to make either of the conductive state or the non-conductivity state into the "on" state.

In the illustrated embodiment, the conductive polymer liquid crystal 53 was prepared by using electric-charge carrier complexes for the electro-conductivity donor radicals B. Such conductive polymer liquid crystal 53 is disclosed in Japanese laid-Open Patent Publication No. 59-59705. Instead of the polymer liquid crystal 53 using electric charge carrier complexes for the eletro-conductive donor radicals B, any other liquid crystal compounds can be used if the electro-conductivity of the liquid crystals are varied in accordance with changes in the orientation and phase transition. For example, a polymer using the conjugating property of main chains present in polyacethylene or the like or an organic conductive polymer using a complex of such polymer and metal.

By using such a conductive aligning layer, the on/off ratio (i.e. the S/N ratio) of a reading signal can be increased for the reason below, thereby securing precise read-out, and reducing the amplification factor of an amplifier provided in the input/output signal controller 31.

Referring to FIG. 8, the on/off ratio of a reading signal when the memory cell is on or off will be described:

In the equivalent circuit shown in FIG. 8 the circuit has an a.c. voltage source 100 for applying a reading voltage between the counter electrode 51 and the upper electrode 41, wherein $C_1$ shows an electrostatic capacitance $C_1$ of an aligning layer 56 toward the counter electrode 51, $C_2$ shows an electrostatic capacitance of the electro-conductive polymer liquid crystal 53, and $C_3$ shows an electrostatic capacitance of the aligning layer 56 toward the upper electrode 41. Likewise, $R_1$ shows a resistance of an aligning layer 56 toward the counter electrode 51, $R_2$ shows a resistance of the electro-conductive polymer liquid crystal 53, and $R_3$ shows a resistance of the aligning layer 56 toward the upper electrode 41.

It is represented that the area of the memory cell is S, the thickness of the polyimide (dielectric) layer 56 is t, the thickness of the electro-conductive polymer liquid crystal layer is L, the specific dielectric constant of the polyimide layer and of the electro-conductive polymer liquid crystal 53 is es, the resistivity of the polyimide layer and of the electro-conductive polymer liquid crystal 53 is p. Then, suppose that the following figures have been given:

S=2 $\mu$m×2 $\mu$m=4×$10^{-12}$ m$^2$
t=0.02 $\mu$m=2×$10^{-8}$ m
L=1.0 $\mu$m=1×$10^{-6}$ m
es of the polyimide layer=3.3
es of the liquid crystal=5.0
p of the polyimide layer=$10^{16}$ $\Omega$·cm
p of the liquid crystal at the "off" state=$10^{12}$ $\Omega$·cm
p of the liquid crystal at the "on" state=$10^6$ $\Omega$·cm Electrostatic capacitance Ci (i=1, 2 and 3) are expressed by the following equation:

$$Ci = e0 \cdot es \cdot S/t \qquad (1)$$

where e0 is the specific dielectric constant having a value of 8.9×$10^{-12}$.

By putting the above figures in the equation (1), C1=C3= 5.9×$10^{-15}$[F] and C2=1.8×$10^{-16}$[F].

Capacitive reactance RC1, RC2 and RC3 of the aligning layer 56 toward the counter electrode 51, the electro-conductive polymer liquid crystal 53 and the aligning layer 56 toward the upper electrode 41, respectively, are expressed by the following equation:

$$RC_i = 1/(2\pi f C_i) \quad (2)$$

where f is the frequency of the reading voltage applied by the source 100 between the counter electrode 51 and the upper electrode 41. In the illustrated embodiment, the reading voltage is an a.c. voltage 60 Hz.

By putting the values of C1, C2, and C3 in the equation (2), RC1, RC2 and RC3 are calculated as $5.0 \times 10^{11}$ Ω, $1.5 \times 10^{13}$ Ω, and $5.0 \times 10^{11}$ Ω.

Resistance Ri is expressed by the following equation (3):

$$R_i = \rho \cdot L/S \quad (3)$$

By putting the figures referred to above in the equation (3), R1 and R3 are $5.0 \times 10^{17}$ Ω, and $R_{OFF2}$ is $2.5 \times 10^{15}$ Ω (at the "off" state), and $R_{ON2}$ is $2.5 \times 10^{9}$ Ω (at the "on" state).

Thus, on the basis of the calculations referred to above, the resistances of the memory cell when it is at the "off" and "on" state are calculated by the equations (4) and (5):

$$\begin{aligned} R_{OFF} &= R1 \cdot RC1/(R1 + RC1) + \\ & \quad R_{OFF2} \cdot RC2/(R_{OFF2} + RC2) + \\ & \quad R3 \cdot RC3/(R3 + RC3) \\ &= 1.6 \times 10^{13}\, \Omega \end{aligned} \quad (4)$$

$$\begin{aligned} R_{ON} &= R1 \cdot RC1/(R1 + RC1) + \\ & \quad R_{ON2} \cdot RC2/(R_{ON2} + RC2) + \\ & \quad R3 \cdot RC3/(R_3 + RC3) \\ &= 1.0 \times 10^{12}\, \Omega \end{aligned} \quad (5)$$

From the equations (4) and (5) the resistance ratio (1/conductivity), that is:

$$R_{OFF}/R_{ON} = 16 \quad (6)$$

It will be understood from the equation (6) that the ratio between the resistances of the memory cell at the "off" and "on" states can be amplified, with the result that the OFF/ON ratio of the reading voltage is amplified. This enhances the reading precision.

When the aligning layer 56 is made of an electro-conductive material, a larger OFF/ON ratio will be achieved. As a result, the reading precision can be more enhanced.

More specifically, a small amount of carbon is added to the polyimide of which the aligning layer is made so as to produce an aligning layer having a resistivity ρ of $10^3$ Ω. From the equation (3) R1=R3=$5 \times 10^4$ Ω. Then, from the equations (4) and (5), $R_{OFF}$ and $R_{ON}$=$1.5 \times 10^{13}$ Ω·cm and $2.5 \times 10^9$ Ω. Therefore, the resistivity OFF/ON ratio is $6.3 \times 10^3$. In this way, the OFF/ON ratio of a reading signal can be more enhanced.

In a mono-domain structure the liquid crystal 53 is transparent, but in a poly-domain the liquid crystal 53 becomes opaque because of light scattering. It is possible to read information by irradiating light and detecting the reflection upon the liquid crystal 53. This method requires optical detecting means but a signal processing means is also included. Therefore, as a whole this falls within the category of electrical information reading methods.

According to the present invention, the following advantages arise:

(1) No rotary or moving mechanism is required because of the omission of optical magnetic disks or magnetic disks, thereby reducing the size, simplifying the structure, and decreasing the production cost of the memory device;

(2) The stored information can be held over a long period of time with stability and with no likelihood of being damaged owing to dust, vibration, and shock because of the omission of complicated, delicate mechanisms such as a laser pick-up or a head;

(3) Because of the simplified structure of the recorder as compared with a non-volatile memory device using an IC non-volatile memory, a large memory area can be achieved;

(4) Regardless of the heat generation, electric crosstalk is prevented from occurring between adjacent electrodes, which makes it possible to shorten the pitches between the memory cells.

Various other modifications will be apparent to and can be readily made by those skilled in the art without departing from the scope and spirit of this invention. Accordingly, it is not intended that the scope of the claims appended hereto be limited to the description as set forth herein, but rather that the claims be broadly construed.

What is claimed is:

1. A non-volatile memory device comprising a memory medium filled between a substrate and a counter-substrate, the memory medium containing a liquid crystal compound, heating means for heating the memory medium so as to write information in the memory medium, read-out means for electrically reading information recorded in said memory medium, the heating means comprising upper and lower electrodes disposed face-to-face one of which is extended in the same direction as either of the substrates, heat generating means sandwiched between the electrodes, and insulating layers interposed between heating means adjacent in direction perpendicular to the upper and lower electrodes, the insulating layers having a low thermal diffusibility.

2. A non-volatile memory device according to claim 1, wherein the memory medium is made of a dielectric polymer liquid crystal.

3. A non-volatile memory device according to claim 1, wherein the memory medium is made of an electro-conductive polymer liquid crystal.

4. A non-volatile memory device according to claim 3, further comprising an aligning layer of electro-conductive material.

5. A non-volatile memory device comprising a substrate and a counter-substrate, a memory medium disposed between the substrate and the counter-substrate, the memory medium containing a liquid crystal compound, heating means disposed between the substrate and the memory means for heating the memory medium so as to write information in the memory medium, the read-out means for electrically reading information recorded in said memory medium.

6. A non-volatile memory device comprising a substrate and a counter-substrate, a memory medium disposed between the substrate and the counter-substrate, the memory medium containing a liquid crystal compound, heating means for heating the memory medium so as to write information in the memory medium, and read-out means for electrically reading information recorded in the memory medium, the heating means comprising upper and lower electrodes disposed face-to-face.

7. A non-volatile memory device comprising:

a pair of opposed substrates;

a memory medium including a liquid crystal compound, the memory medium being disposed between the pair of substrates;

heating means disposed on one of said substrates for heating the memory medium to enable the memory medium to record information, the heating means including upper and lower electrodes and heat generating means sandwiched between areas of overlap of the upper and lower electrodes;

reading means for electrically reading information stored in the memory medium.

8. A non-volatile memory device according to claim 7, including thermal insulating means disposed between separate areas of overlap of the upper and lower electrodes for preventing thermal cross-talk between different areas of the memory medium.

9. A non-volatile memory device according to claim 7, wherein the reading means includes a counter-electrode disposed on the other of the substrates opposite the upper electrode.

10. A non-volatile memory device according to claim 9, wherein the reading means includes means for applying a reading voltage between the counter-electrode and the upper electrode.

11. A non-volatile memory device according to claim 7, wherein the reading means includes means for detecting the resistance of the memory medium.

12. A non-volatile memory device according to claim 7, wherein at least one of the substrates is transparent.

13. A non-volatile memory device, comprising:

a memory medium formed between a first substrate and a second substrate, said memory medium comprising a plurality of memory cells formed of a liquid crystal material;

a plurality of electrothermal heating means arranged on at least one of said first substrate and said second substrate, each of said plurality of electro-thermal heating means corresponding to a respective one of said memory cells;

writing means for writing data to said memory device by selectively activating at least one of said electrothermal heating means whereby said liquid crystal material in said memory cell corresponding to said selectively activated electrothermal heating means is heated so as to permit a change in a property of said liquid crystal material; and reading means for electrically reading the data written to said memory device by detecting said change in said property.

14. The memory device of claim 13, wherein each of said plurality of electrothermal heating means comprises a pair of electrodes with a heat generating layer interposed between said pair of electrodes.

* * * * *